(12) United States Patent
Baer et al.

(10) Patent No.: US 9,545,032 B2
(45) Date of Patent: Jan. 10, 2017

(54) ENCLOSURE FOR AN ELECTRONIC ASSEMBLY FOR A BATTERY POWERED LAWN MOWER

(71) Applicant: Accelerated Systems Inc., Waterloo (CA)

(72) Inventors: Stanley Arthur Baer, Waterloo (CA); Desmond Mark Robertson Smyth, Waterloo (CA); Ransom Thomas Green, Waterloo (CA); Christopher Keith Derbecker, Waterloo (CA); Robert Gordon Lankin, Waterloo (CA)

(73) Assignee: Accelerated Systems Inc., Waterloo, Ontario (CA)

( * ) Notice: Subject to any disclaimer, the term of this patent is extended or adjusted under 35 U.S.C. 154(b) by 148 days.

(21) Appl. No.: 14/354,652

(22) PCT Filed: Oct. 24, 2012

(86) PCT No.: PCT/CA2012/000981
§ 371 (c)(1),
(2) Date: Apr. 28, 2014

(87) PCT Pub. No.: WO2013/059917
PCT Pub. Date: May 2, 2013

(65) Prior Publication Data
US 2016/0044825 A1    Feb. 11, 2016

Related U.S. Application Data

(60) Provisional application No. 61/551,706, filed on Oct. 26, 2011.

(51) Int. Cl.
H05K 7/20 (2006.01)
H05K 5/02 (2006.01)
E01H 5/08 (2006.01)

(52) U.S. Cl.
CPC .......... *H05K 7/2039* (2013.01); *H05K 5/0217* (2013.01); *H05K 7/209* (2013.01);
(Continued)

(58) Field of Classification Search
None
See application file for complete search history.

(56) References Cited

U.S. PATENT DOCUMENTS 4,557,225 A * 12/1985 Sagues ................ F02D 41/3005
123/41.31
5,274,193 A * 12/1993 Bailey ................. H01L 23/4093
165/80.3
(Continued)

*Primary Examiner* — Courtney Smith
(74) *Attorney, Agent, or Firm* — Bereskin & Parr LLP

(57) ABSTRACT

An enclosure includes a housing defining an interior chamber for receiving an electronic assembly. The housing is made of a thermally conductive material so as to operate as a heat sink. The housing has a heat transfer surface within the interior chamber for receiving heat generating components thereon, and an interior groove within the interior chamber. The enclosure also includes a retaining clip having a clip length, a first portion extending along the clip length for engaging the interior groove, and a second portion extending along the clip length for engaging the heat generating components. The retaining clip is made from a resilient material and is sized and shaped such that positioning the first portion in the interior groove flexes the retaining clip and presses the second portion against the heat generating components so as to bias the heat generating components into thermal contact with the heat transfer surface.

20 Claims, 7 Drawing Sheets

(52) U.S. Cl.
 CPC ....... *H05K 7/2049* (2013.01); *H05K 7/20436* (2013.01); *E01H 5/08* (2013.01)

(56) References Cited

U.S. PATENT DOCUMENTS

| | | | | |
|---|---|---|---|---|
| 5,309,979 | A * | 5/1994 | Brauer | H01L 23/4093 165/80.2 |
| 5,327,324 | A * | 7/1994 | Roth | H05K 7/20854 174/16.3 |
| 5,466,970 | A * | 11/1995 | Smithers | H01L 23/4093 257/712 |
| 5,909,358 | A * | 6/1999 | Bradt | H01L 23/4093 257/726 |
| 6,266,244 | B1 * | 7/2001 | Guthrie | H01L 23/40 165/80.3 |
| 6,411,514 | B1 * | 6/2002 | Hussaini | H05K 7/209 165/104.33 |
| 2008/0278918 | A1 * | 11/2008 | Tominaga | B62D 5/0406 361/719 |

* cited by examiner

ENCLOSURE FOR AN ELECTRONIC ASSEMBLY FOR A BATTERY POWERED LAWN MOWER

RELATED APPLICATIONS

This application claims the benefit of U.S. Provisional Patent Application Ser. No. 61/551,706 filed on Oct. 26, 2011 and entitled "Enclosure for an Electronic Assembly for a Battery Powered Lawn Mower", the entire contents of which are hereby incorporated by reference herein for all purposes.

TECHNICAL FIELD

The embodiments herein relate to enclosures, and in particular, to enclosures for electronic assemblies for use with vehicles such as battery powered lawn mowers, riding snow blowers, riding lawn tractors, e-scooters, and other light electric vehicles.

INTRODUCTION

Electronic assemblies such as power controllers are used in a variety of applications. One such application is on a battery powered lawn mower for controlling and communicating with various electronic components, such as deck speed motors, wheel motors, brake sensors, steering sensors, and so on.

These electronic assemblies are often contained within enclosures. The enclosures protect the electronic assembly from weather, mechanical impacts, water, and so on. This can be particularly beneficial when electronic assembly is used on a battery powered lawn mower because the lawn mower often encounters dust, debris, moisture, and other environmental factors that could damage the electronic assembly.

In some cases, the enclosure can also function as a heat sink so as to dissipate heat from various heat generating components the electronic assembly, such as power transistors (e.g. MOSFETs), rectifiers, and so on. For example, the enclosure may be made from a thermally conductive material, and the heat generating components may be positioned in thermal contact with a thermally conductive enclosure so as to dissipate heat.

While enclosures can provide numerous benefits, the costs associated with providing mechanical barriers, weather seals, and thermal management can substantially increase the overall manufacturing costs of the enclosure. Accordingly, it can be desirable to minimize or reduce the manufacturing costs of the enclosure.

Another difficulty is that there may be limited available space for mounting the enclosure. For example, battery powered lawn mowers and e-scooters often have limited space given their relatively small form factor, and various other features included on the lawn mower. Accordingly, it can be desirable to reduce or minimize the overall size of the enclosure for allowing installation and use in compact applications.

SUMMARY OF SOME EMBODIMENTS

According to some embodiments, there is provided an enclosure including a housing extending along a longitudinal axis and defining an interior chamber for receiving an electronic assembly. The housing is made of a thermally conductive material so as to operate as a heat sink. The housing has at least one heat transfer surface extending along the longitudinal axis within the interior chamber for receiving a plurality of heat generating components of the electronic assembly thereon, and at least one interior groove extending along the longitudinal axis within the interior chamber. Furthermore, the enclosure includes at least one retaining clip for biasing the heat generating components into thermal contact with the heat transfer surface of the housing. Each retaining clip has a clip length, a first portion extending along the clip length for engaging the interior groove of the housing so as to secure the retaining clip in place, and a second portion extending along the clip length and spaced apart transversely from the first portion for engaging the plurality of heat generating components. The retaining clip is made from a resilient material and is sized and shaped such that positioning the first portion in the interior groove flexes the retaining clip and presses the second portion against the heat generating components so as to bias the heat generating components into thermal contact with the heat transfer surface.

In some embodiments, the second portion may include a plurality of tabs spaced apart along the clip length. Each tab may be sized and shaped to engage a corresponding one of the plurality of heat generating components.

In some embodiments, the housing may have a housing length extending along the longitudinal axis, and the clip length may be at least 50% of the housing length.

In some embodiments, the housing may have an exterior opening for receiving at least one electrical connector extending outwardly from the interior chamber. The exterior opening may extend along the longitudinal axis. The exterior opening may have a transverse width of less than about 30 millimeters.

Furthermore, in some embodiments, the enclosure may include a sealing member for covering the exterior opening. The sealing member may have at least one aperture for receiving the at least one electrical connector therethrough. The sealing member may be made from an elastomeric material.

In some embodiments, the housing may extend longitudinally between two opposing open ends, and the enclosure may further include end caps for covering the opposing open ends.

Furthermore, in some embodiments, at least one of end caps may have a peripheral edge with at least one wire channel therein for receiving a wire extending from at least one wire terminal and out the end cap. The wire channel may be sized and shaped to provide mechanical strain relief for the wire.

In some embodiments, at least one of the end caps may have drainage holes therein.

In some embodiments, the housing may be made from an extruded profile.

In some embodiments, the housing may have at least one sloped wall, and the heat transfer surface may be located on the sloped wall.

According to some embodiments, there is provided a power controller including a housing extending along a longitudinal axis and defining an interior chamber. The housing is made of a thermally conductive material so as to operate as a heat sink. The housing has at least one heat transfer surface extending along the longitudinal axis within the interior chamber, and at least one interior groove extending along the longitudinal axis within the interior chamber. The power controller also includes an electronic assembly positioned within the interior chamber. The electronic assembly includes a plurality of heat generating components positioned on the heat transfer surface of the housing. Furthermore, the power controller includes at least one retaining clip for biasing the heat generating components into thermal contact with the heat transfer surface of the housing. Each retaining clip has a clip length, a first portion extending along the clip length for engaging the interior groove of the housing so as to secure the retaining clip in place, and a second portion extending along the clip length and spaced apart transversely from the first portion for engaging the plurality of heat generating components. The retaining clip is made from a resilient material and is sized and shaped such that positioning the first portion in the interior groove flexes the retaining clip and presses the second portion against the heat generating components so as to bias the heat generating components into thermal contact with the heat transfer surface.

Other aspects and features will become apparent, to those ordinarily skilled in the art, upon review of the following description of some exemplary embodiments.

BRIEF DESCRIPTION OF THE DRAWINGS

The drawings included herewith are for illustrating various examples of articles, methods, and apparatuses of the present specification and are not intended to limit the scope of what is taught in any way. In the drawings.

DETAILED DESCRIPTION OF SOME EMBODIMENTS

Figure 1:
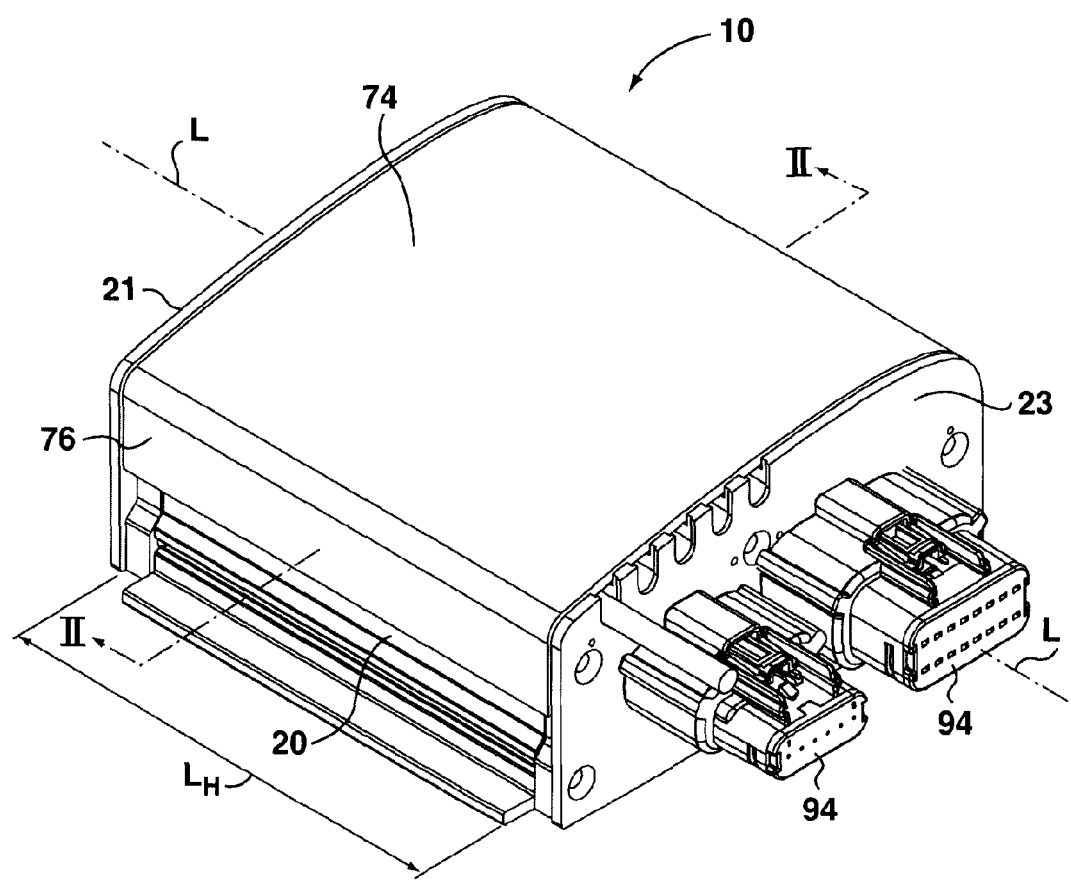
FIG. 1 is a perspective view of an enclosure for an electronic assembly according to one embodiment.
Figure 2:
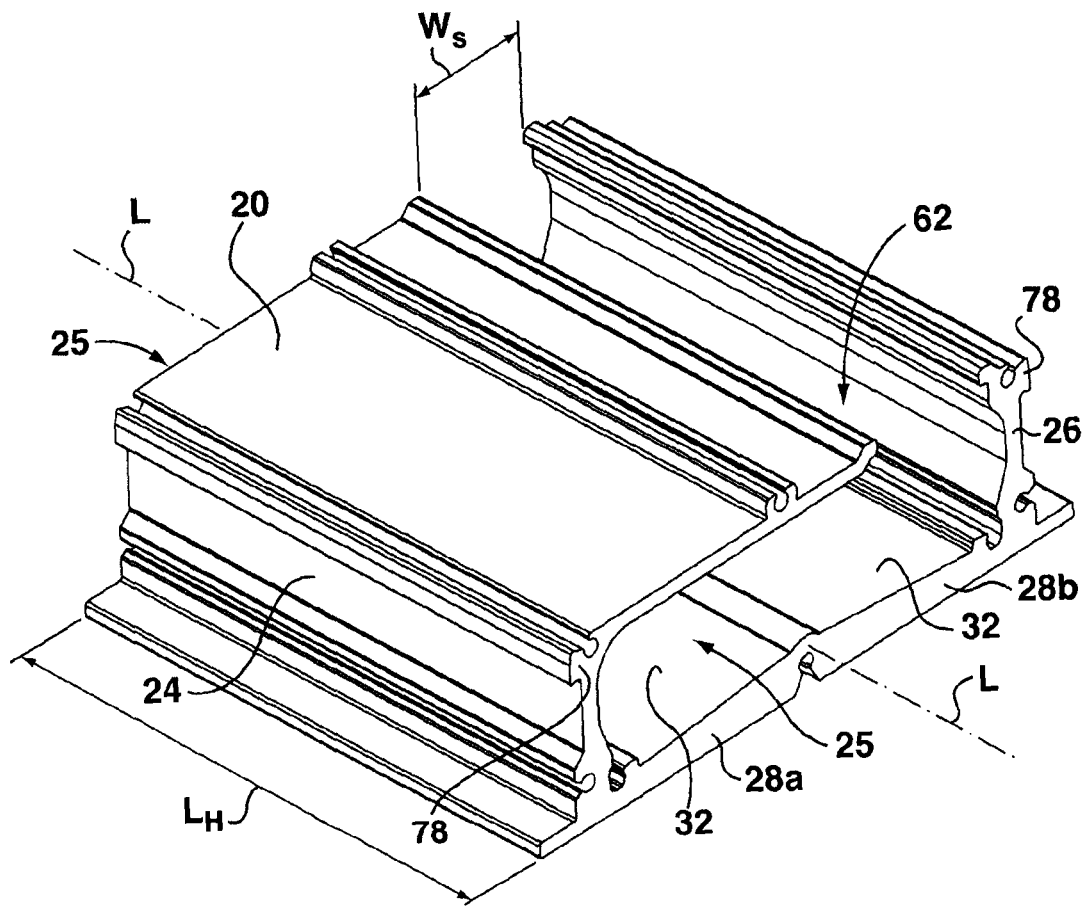
FIG. 2 is a perspective view of a housing of the enclosure of FIG. 1.
Figure 3:
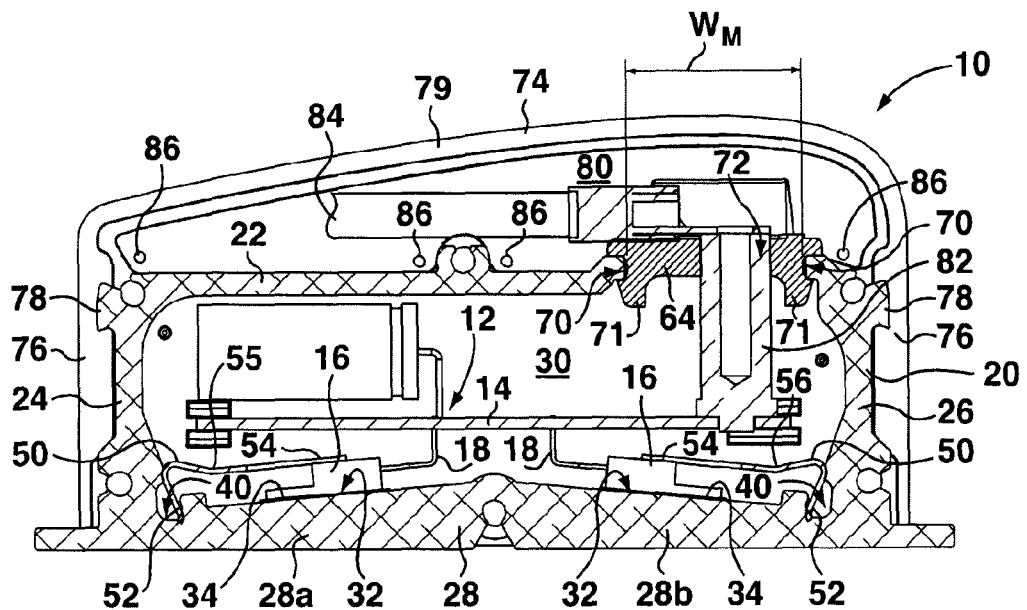
FIG. 3 is a cross-sectional view of the enclosure of FIG. 1 taken along the line II-II with a retaining clip in a clipped position so as to bias a heat generating component into thermal contact with a heat transfer surface.

Referring to FIGS. 1-3, illustrated therein is an enclosure 10 for an electronic assembly 12 (shown in FIG. 3), such as a power controller of a vehicle such as a battery powered riding lawn mower, an e-scooter or another light electric vehicle. In other embodiments, the enclosure 10 may be used with other electronic assemblies, such as controllers for other vehicles, power converters, power amplifiers, and so on.

Referring specifically to FIG. 2, the enclosure 10 includes a housing 20 extending along a longitudinal axis L. More particularly, the housing 20 extends longitudinally between two opposing open ends 25, and has a housing length $L_H$. Each open end 25 of the housing 20 may be covered by a corresponding end cap 21, 23 fastened to the housing 20 (shown in FIG. 1). The end caps 21, 23 may be fastened to the housing 20 using screws, or other fasteners such as bolts, clips, and so on.

The housing 20 may have a generally rectangular cross-sectional shape. For example, the housing may include an upper wall 22, two longitudinally extending side walls 24, 26, and a bottom wall 28. In other embodiments, the housing 20 may have other shapes or configurations.

In some embodiments, the housing 20 may be made from an extruded material, such as extruded aluminum profile. When making the housing 20 from extruded material, it is possible to manufacture enclosures of various lengths for different sized electronic assemblies. For example, a longer housing 20 may be used for longer electronic assemblies (e.g. power controllers with higher power ratings), and a shorter housing 20 may be used for smaller electronic assemblies (e.g. power controllers with lower power ratings).

As shown in FIG. 3, the housing 20 defines an interior chamber 30 for receiving the electronic assembly 12. In particular, the interior chamber 30 is generally defined by the walls 22, 24, 26 and 28.

The electronic assembly 12 may include a substrate 14, such as a printed circuit board (PCB), positioned within the interior chamber 30. A number of electronic components may be located on the substrate 14, such as microprocessors, capacitors, memory storage devices, and so on. Furthermore, a number of electronic components may be located separately from the substrate 14, including heat generating components 16 such as a power transistor (e.g. a MOSFET), a rectifier, and so on.

As shown, the heat generating components 16 may be positioned against the bottom wall 28 or other portions of the housing 20. The heat generating components 16 may be electrically connected to other components of the electronic assembly 12 via electrical leads 18. Furthermore, the heat generating components 16 may support the substrate via the leads 18, for example, to suspend the substrate between the top wall 22 and the bottom wall 28.

In some embodiments, the housing 20 is made of a thermally conductive material such as aluminium, which allows the housing 20 to operate as a heat sink for the heat generating components 16. In particular, the housing 20 may have two heat transfer surfaces 32 located within the interior chamber 30 (e.g. on the bottom wall 28), and the heat generating components 16 of the electronic assembly 12 are positioned thereon.

Figure 10:
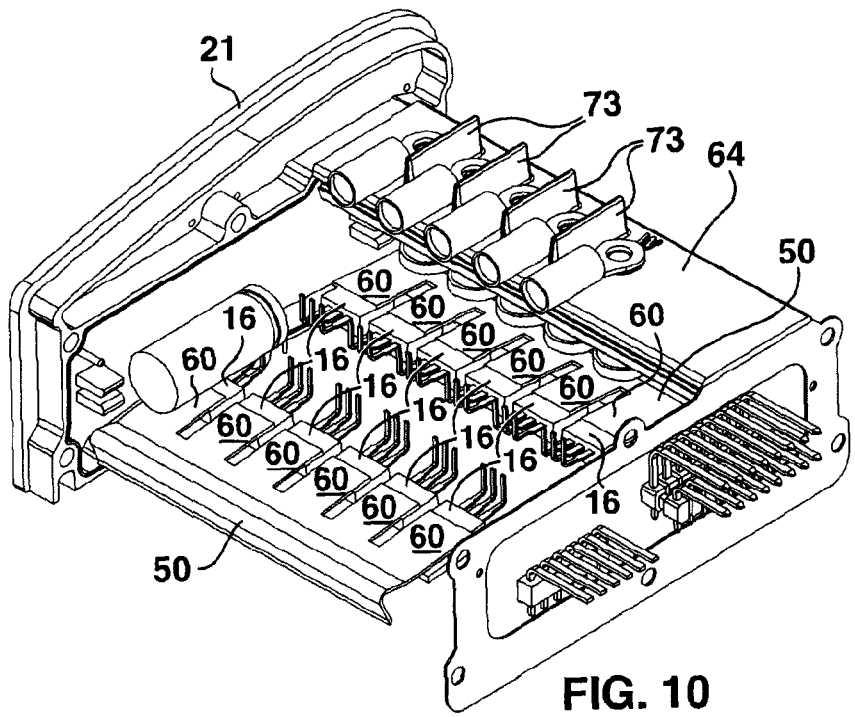
FIG. 10 is a perspective view of the enclosure of FIG. 9 with the housing and end cap removed to show two retaining clips being used with two rows of heat generating components.

As shown in FIG. 2, each heat transfer surface 32 may extend along the longitudinal axis L. Furthermore, as indicated in FIG. 10, a row of heat generating components 16 may be positioned along or adjacent each heat transfer surface 32.

In some embodiments, there may be one or more heat transfer surfaces 32, for example, depending on the number and layout of the heat generating components 16. Furthermore, while the heat transfer surfaces 32 are shown as being located on the bottom wall 28, in other embodiments, the heat transfer surfaces may have other locations, such as on the top wall 22 or the side walls 24, 26.

In some embodiments, there may be a thermal interface 34 between the heat generating component 16 and the heat transfer surface 32, such as thermal tape, thermal epoxy, and so on. The thermal interface 34 may enhance heat transfer (e.g. conduction) from the heat generating component 16 to the housing 20.

The thermal interface 34 may also electrically isolate the heat generating component 36 from the housing 20. Accordingly, the thermal interface 34 may be made from a dielectric material.

Referring to FIG. 3, the enclosure 10 may include retaining clips 50 for biasing the heat generating components 16 into thermal contact with the heat transfer surfaces 32. The added pressure applied by the retaining clips 50 may improve thermal contact between the heat generating components 16 and the heat transfer surface 32, and thus enhance heat transfer therebetween. Furthermore, in some embodiments, the retaining clips 50 might also be thermally conductive and thus provide another mechanism for dissipating heat from the heating generating components 16.

In some embodiments, the retaining clips 50 may be secured to the housing 20 using snap-in connections as described below. The use of a snap-in connection reduces the need for separate fasteners such as screws or bolts that might otherwise increase the cost of the enclosure 10 and require additional steps in assembly of the enclosure 10.

As shown, the housing 20 has two interior grooves 40 extending along the longitudinal axis L within the interior chamber 30. The interior grooves 40 may be located generally adjacent to the heat transfer surfaces 32. More particularly, the interior grooves 40 may be formed at the lower corners between the side walls 24, 26 and the bottom wall 28. Each interior groove 40 is shaped to receive a portion of a corresponding retaining clip 50.

Figure 6:
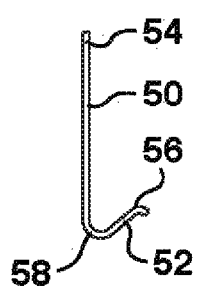
FIG. 6 is an end view of the retaining clip.

Referring to FIGS. 3 and 6, each retaining clip 50 has a cross-section with a first portion 52 for engaging the interior groove 40 of the housing 30 so as to secure the retaining clip 50 in place, and a second portion 54 for engaging the heat generating component 16. The second portion 54 is spaced apart transversely from the first portion 52.

The retaining clip 50 is made from a resilient material, such as spring steel. Furthermore, the retaining clip 50 is sized and shaped such that positioning the first portion 52 in the interior groove 40 imparts an elastic deformation of the retaining clip 50, thus pressing the second portion 54 against the heat generating components 16. This in turn biases the heat generating component 16 into thermal contact with the heat transfer surface 32.

Figure 4:
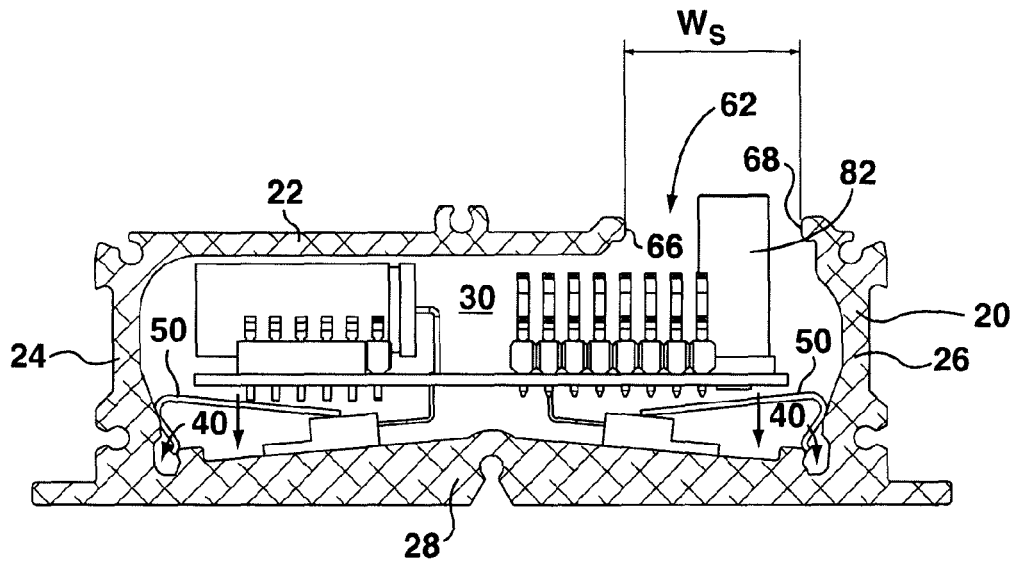
FIG. 4 is a cross-sectional view of the enclosure of FIG. 1 along the line II-II with a retaining clip in an unclipped position.

Referring to FIGS. 3 and 4, a method of installing the retaining clip 50 will now be described. Prior to installing the retaining clip 50, the electronic assembly 12 may be inserted into the interior chamber 30 longitudinally through one of the open ends 25 of the housing 20 (i.e. with the end caps 21, 23 removed). Furthermore, the heat generating components 16 may be positioned on the heat transfer surfaces 32.

Once the electronic assembly 12 is installed, the retaining clip 50 can be inserted into the interior chamber 30, generally longitudinally through the open ends 25 of the housing 20. More particularly, as shown in FIG. 4, the retaining clip 50 is positioned in an unclipped position with the first portion 52 located above the interior groove 40 and the second portion 54 located above the heat generating component.

The retaining clip 50 is then advanced into a clipped position by forcing the retaining clip 50 downward such that the first portion 52 snaps into the interior groove 40 (shown in FIG. 3). At the same time, the retaining clip 50 elastically deforms (in some cases about an inflection point 55), and the second portion 54 presses downward onto the heat generating component 16. As shown, the second portion 54 may be substantially flush against the top surface of the heat generating component 16 when the retaining clip 50 is in the clipped position.

In some embodiments, the retaining clip 50 may be pressed into the clipped position using a tool, such as a clamp, a hydraulic piston, and so on.

In some embodiments, the retaining clip 50 may be removable, for example, by prying the first portion 52 from the interior groove 40. This may be desirable when performing maintenance or repairs on the electronic assembly 12, such as when replacing one or more of the heat generating components (e.g. MOSFETs).

As shown in FIG. 4, there may be limited clearance between the substrate 14 and the bottom wall 28 for inserting the retaining clip 50 into the interior chamber 30. To help provide more space, the bottom wall 28 may include outwardly sloped wall portions 28a, 28b, and the heat transfer surfaces 32 may be located on the sloped wall portions 28a, 28b. The angle of the sloped wall portions 28a, 28b may be selected so as to provide more clearance when inserting the retaining clip 50 between the substrate 14 and the bottom wall 28, while still maintaining a strong, yet slim form factor for the enclosure 10.

In some embodiments, the angle of the sloped wall portions 28a, 28b may also be selected so that the second portion 54 presses substantially flush against the top surface of the heat generating component 16 when the retaining clip 50 is in the clipped position.

Referring now to FIGS. 5-8 the retaining clip 50 will be described in more detail.

Figure 5:
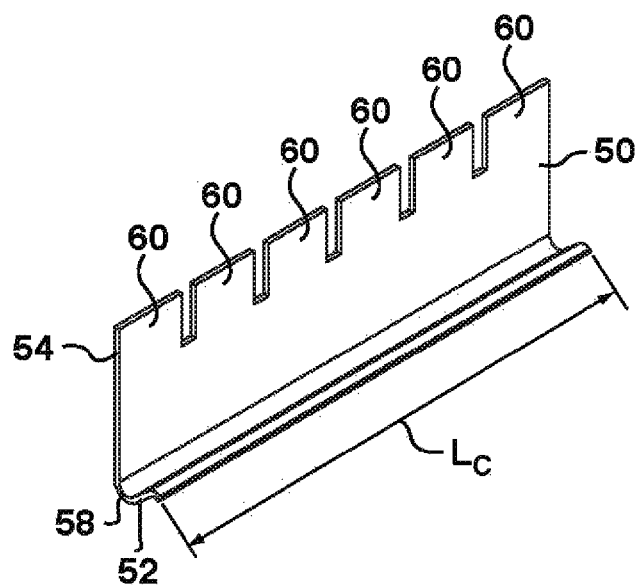
FIG. 5 is a perspective view of the retaining clip.
Figure 7:
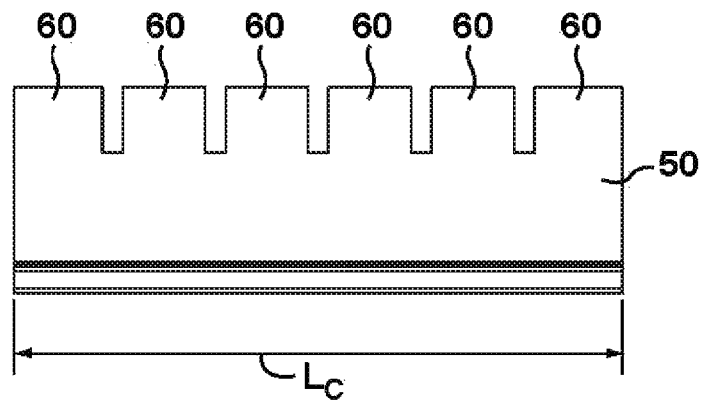
FIG. 7 is a front view of the retaining clip.

As shown in FIGS. 5 and 7, the retaining clip 50 has a clip length $L_C$. Furthermore, in this embodiment the first portion 52 and the second portion 54 extend along the clip length $L_C$. This allows a single retaining clip 50 to be used with a row of heat generating components 16. For example, as shown in FIG. 10, the retaining clip 50 may be used to bias a row of six separate heat generating components 16 into thermal contact with the heat transfer surface 32 (the heat transfer surface 32 is not shown in FIG. 10 for clarity).

In some embodiments, the clip length $L_C$ may be at least 50% of the housing length $L_H$. More particularly, in some embodiments, the clip length $L_C$ may be at least 75% of the housing length $L_H$.

In some embodiments, more than one retaining clip 50 may be used with each row of heat generating components 16. For example, two retaining clips 50 may be used for each row of heat generating components 16.

In some embodiments, the second portion 54 may include tabs 60 spaced apart along the clip length $L_C$. Each tab 60 may be sized and shaped to engage a corresponding heat generating component 16. The tabs 60 may allow the retaining clip 50 to flex more easily when engaging each particular heat generating component 16, and may also allow the retaining clip 50 to flex to different degrees to accommodate heat generating components 16 of different shapes and sizes (e.g. MOSFETs of different thicknesses).

In other embodiments, the second portion 54 may be formed as a solid strip without tabs.

As indicated above, the first portion 52 of the retaining clip 50 is shaped to engage the interior groove 40 so as to secure the retaining clip 50 in place. More particularly, with reference to FIG. 8, the first portion 52 may have a first bend 56 for engaging a first abutment 42 adjacent one side of the interior groove 40. The first portion 52 may also have a second bend 58 for engaging a second abutment 44 adjacent the other side of the interior groove 40 (shown in FIG. 8). The engagement between the bends 56, 58 and abutments 42, 44 can help secure the retaining clip 50 in the clipped position and can inhibit or prevent unintentional removal of the retaining clip 50.

As shown in FIG. 6, the first portion 52 may be shaped generally as a spline or S-curve such that the bends 56, 58 are formed as curved portions. The curved bends 56, 58 can gradually slide across corresponding curves of the abutments 42, 44 as the first portion clips into the interior groove 40. The curved bends 56, 58 can be particularly beneficial when using long retaining clips 50, which might otherwise be difficult to snap into the interior groove 40.

In other embodiments, the first portion may have other shapes. For example, the bends 56, 58 may be formed a sharp corners, rather than curved portions. Furthermore, in some embodiments, the first portion 52 may have only the second bend 58 (and not the first bend 56).

Figure 8:
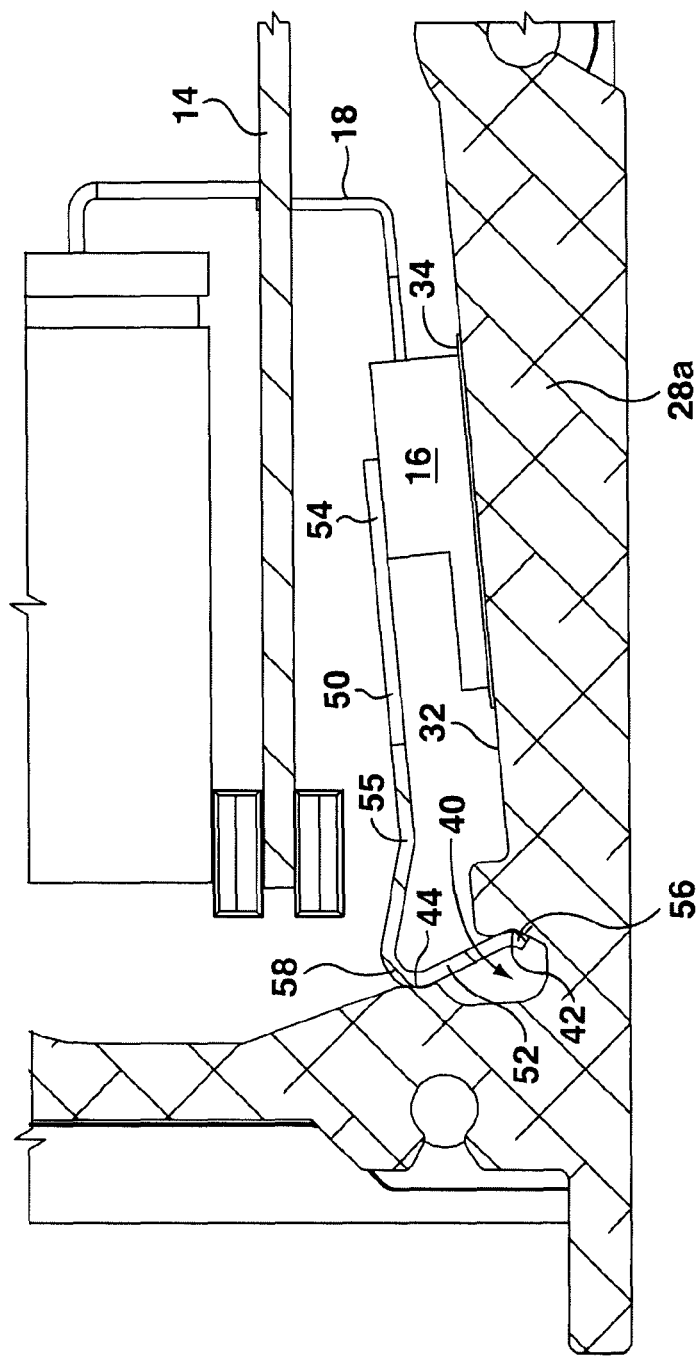
FIG. 8 is an enlarged view of the enclosure showing the retaining clip in the clipped position.

As shown in FIG. 8, the abutments 42, 44 are curved surfaces, which can help guide the curved bends 56, 58 while clipping the first portion 52 of the retaining clip 50 into the interior groove 40. Furthermore, the abutments 42, 44 may overhang the interior groove 40 so as to help secure the retaining clip 50 in the clipped position. In particular, the first abutment 42 may be defined by a lip that overhangs the interior groove 40, and the second abutment 44 may be defined by a swell or protruding portion on the side wall (e.g. the left side wall 24). The swell may also have a recess specifically shaped to receive and engage the second bend 58. The recess may also help secure the retaining clip 50 in the clipped position.

In other embodiments, the abutments 42, 44 may have other shapes. For example, the interior groove 40 may be formed as a straight slot and the abutments may be defined by the flat walls of the straight slot.

Referring again to FIGS. 2 and 4, the housing 20 may have an exterior opening 62 for providing access to the interior chamber 30. As shown, the exterior opening 62 may be formed along the top wall 22, and in particular, may be a slot extending along the longitudinal axis L. In some embodiments, the exterior opening 62 may extend along the entire housing length $L_H$, and may be formed as part of the extrusion when forming the housing 20.

Figure 9:
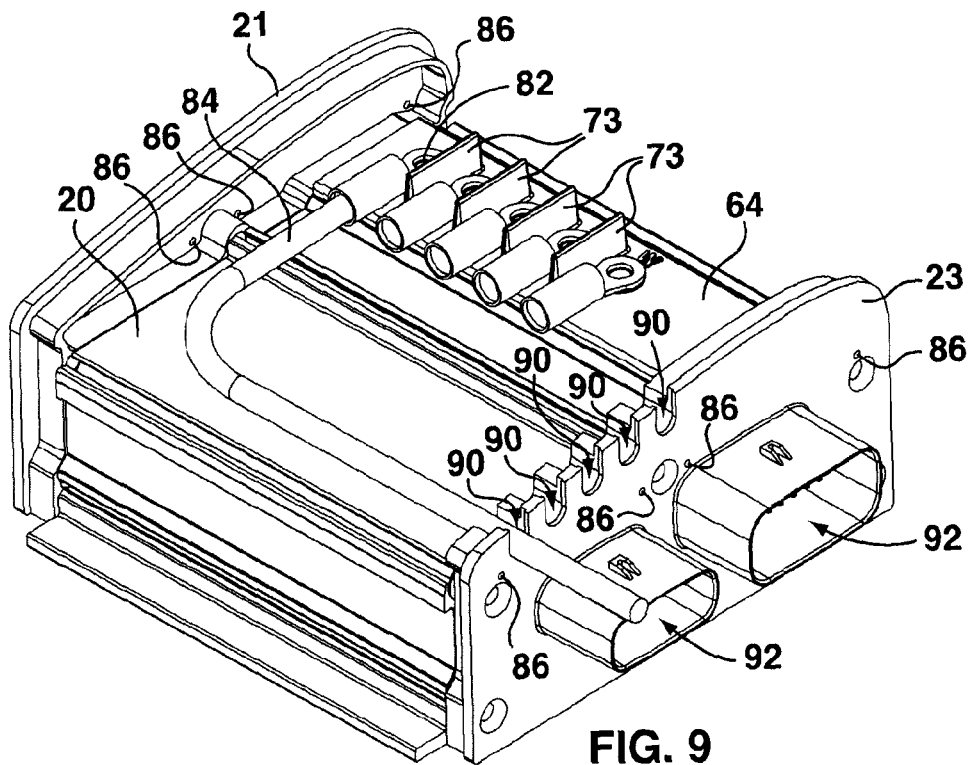
FIG. 9 is a perspective view of the enclosure of FIG. 1 with a top cover removed.

The exterior opening 62 may allow one or more electrical connectors to extend from the electronic assembly 12 and outwardly therethrough. For example, as shown in FIG. 4, the electrical connector may be an electrical power terminal 82 extending upwardly from the substrate 14 and outwardly through the exterior opening 62. More particularly, as shown in FIG. 9, a row of electrical power terminals 82 may extend upwardly through the exterior opening 62. The power terminals 82 may provide power to the electronic assembly 12 from a power source, such as an on-board battery of a battery powered riding lawn mower (or another light electric vehicle), or receive power from the electronic assembly 12 for distribution to other components on the electric mower (e.g. drive motors, deck motors, etc.).

Providing the exterior opening 62 along the top wall 22 of the housing 20 enables the power terminals 82 to extend outwardly through the top of the housing 20, which can enable the enclosure 10 to be mounted in an area with limited adjacent side-clearance or end-clearance. In contrast, other enclosures with power terminals at the sides of the housing might not be suitable for mounting in areas with limited adjacent side-clearance or end-clearance.

In other embodiments, the exterior opening 62 may be located in other positions, such as on the side walls 24, 26 or the bottom wall 28.

In some embodiments, the exterior opening 62 may only extend along a portion of the housing length $L_H$. For example, the housing 20 may be extruded as a solid rectangular tube, and then a portion of the top wall 22 may be cut-out to provide the exterior opening 62. However, as this requires an additional manufacturing step it may be beneficial if the exterior opening 62 is formed as the housing 20 is formed, for example by extrusion.

Referring to FIGS. 3, 9 and 10, the enclosure 10 may include a sealing member 64 for covering the exterior opening 62. The sealing member 64 may help protect the interior chamber 30 from dust, debris, moisture (e.g. rain, snow), and other environmental factors.

In some embodiments, the sealing member 64 may be made from an elastomeric material such as rubber and may extend along the entire length of the exterior opening 62.

The sealing member 64 is generally sized and shaped to fit snugly within the exterior opening 62 so as to provide a seal along the top wall 22. More particularly, as shown in FIGS. 2 and 4, the exterior opening 62 may have a slot width $W_S$ extending between two longitudinal edges 66, 68 of the housing 20, and the sealing member 64 may have a sealing member width $W_M$ slightly larger than the slot width $W_S$ so as to provide an interference fit when inserted therein.

As shown in FIG. 3, the sealing member 64 may also have side channels 70 for receiving and overhanging the longitudinal edges 66, 68 of the housing 20. The side channels 70 may help provide a better seal.

Referring to FIGS. 3 and 9, the sealing member 64 may have a number of apertures 72 for receiving the electrical terminals 82 therethrough. The apertures 72 may be sized smaller than the electrical terminals 82 so as to provide a tight seal therebetween.

As shown in FIGS. 9 and 10, the sealing member 64 may also include upright tabs 73 spaced apart along the length of the sealing member 64 between the apertures 72 (the apertures 72 are not visible in FIGS. 9 and 10). The tabs 73 may help electrically isolate the electrical terminals 82 from each other so as to prevent or reduce the likelihood of a short circuit between the terminals 82.

In some embodiments, the cross-sectional shape and size of the sealing member 64 may be selected to provide some degree of rigidity. For example, the sealing member 64 may have a width and a thickness selected to provide rigidity. In particular, the sealing member 64 may have a width-to-thickness ratio of less than about 10:1. More particularly, the sealing member 64 may have a width of less than about 40 millimeters, and a thickness of at least about 4 millimeters. In some embodiments, the sealing member 64 may have a width of about 25 millimeters, and a thickness of about 5 millimeters.

The sealing member 64 may also have reinforcing strips 71, which in some cases may be located on the bottom of the sealing member 64. The reinforcing strips 71 may increase the rigidity of the sealing member 64, and in particularly, may inhibit bending of the sealing member 71 along its length.

Figure 11:
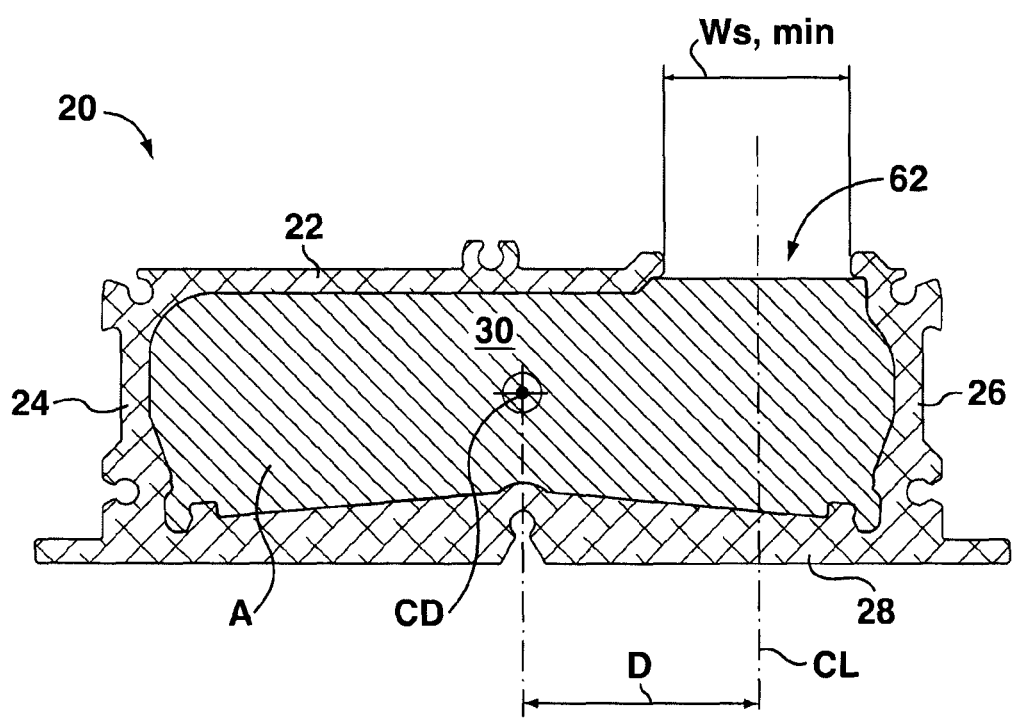
FIG. 11 is a cross-sectional view of the enclosure of FIG. 3 only showing the housing for clarity.

When making the housing 20 from extruded materials such as extruded aluminum, the width and position of the exterior opening 62 may have some minimum and maximum values due to manufacturing limitations. For example, with reference to FIG. 11, there may be some minimum slot width $W_{S, min}$ based on a ratio of cross-sectional area A of the interior chamber 30, and a distance D between a centerline CL of the exterior opening 62 and a centroid CD of the cross-sectional area A of the interior chamber 30. The specific relationship between these values may be based on how much stress the extrusion die can withstand while extruding the housing 20. In some embodiments, the minimum slot width $W_{S,\,min}$ may be about 20 millimeters.

In some embodiments, the width of the sealing member 64 may be constrained by the minimum slot width $W_{S,\,min}$. For example, the sealing member width $W_M$ may be between about 20 millimeters and about 30 millimeters so as to provide the sealing member 64 with sufficient rigidity, while still enabling the housing 20 to be manufactured from extruded aluminum.

In some embodiments, the housing 20 may be formed using other manufacturing techniques, and in such embodiments, the slot width $W_S$ may be smaller than the minimum slot width $W_{S,\,min}$ described above.

Referring to FIGS. 1 and 3, the enclosure 10 may include a cover 74 shaped to engage the housing 20 and cover portions thereof.

In some embodiments, the cover 74 may be removable. For example, the cover 74 may include side walls 76 having channels therein for receiving corresponding locking tabs 78 that protrude outwardly from the side walls 24, 26 of the housing 20. The channels and locking tabs 78 may be sized and shaped to provide a snap fitting.

The cover 74 also includes a top wall 79 spaced apart from the top wall 22 of the housing 20 and sized and shaped so as to define a second chamber 80. The second chamber 80 may contain additional components, such as electrical terminals 82, electrical wires 84, and so on. Generally, the cover 74 provides physical protection to components in the second chamber 80, for example, from debris that might otherwise strike and damage the components. The cover 74 may also include gaskets or other seals to provide some degree of protection from dust, moisture, and so on.

Referring now to FIG. 9 the enclosure 10 may include two end caps 21, 23 fastened to the open ends 25 of the housing 20. The end caps 21, 23 may include gaskets or other seals for sealing the interior chamber 30 and/or the second chamber 80.

In some embodiments, the end caps 21, 23 may have drainage holes 86 aligned with the second chamber 80 so as to provide drainage therefrom. As shown in FIG. 3, the drainage holes 86 may be located on the end caps 21, 23 in a position aligned with a bottom portion of the second chamber 80.

As shown in FIG. 9, the front end cap 23 may have a peripheral edge 90 with one or more wire guide channels 90 therein for receiving corresponding wires 84 extending from corresponding electrical terminals 82 and out through the end cap 23 (only one wire is shown). Each wire guide channel 90 may be sized and shaped to provide mechanical strain relief for a corresponding wire 84. In some embodiments, a grommet or another strain relief mechanism may be provided within each wire guide channel 90 to provide enhanced strain relief.

In some embodiments, a manufacturer may make a number of different end caps with wire guide channels 90 of different sizes. As such, each end cap may be used with wires of different sizes, for example, when making power controllers of different power ratings, which may require wires of having specific wire gauges.

Furthermore, in some embodiments, a standard end cap may be provided with a receptacle for receiving one of a number of different interchangeable wire guide inserts having wire guide channels of different sizes. Accordingly, the different wire guide inserts may be used for power controllers of different power ratings.

Referring to FIG. 9, the end cap 23 may also include one or more terminal sockets 92. As shown in FIG. 1, the sockets 92 may be adapted to receive a plug 94 of a multi-terminal connector (MTC). The MTCs may provide wire connections to various components, such as components of a battery powered riding lawn mower (or another light electric vehicle) including, steering sensors, brake sensors, wheel motors, and so on.

While the above description provides examples of one or more apparatus, methods, or systems, it will be appreciated that other apparatus, methods, or systems may be within the scope of the present description as interpreted by one of skill in the art.

The invention claimed is:

1. An enclosure comprising:
   (a) a housing extending along a longitudinal axis and defining an interior chamber for receiving an electronic assembly, the housing being made of a thermally conductive material so as to operate as a heat sink, the housing having:
      (i) at least one heat transfer surface extending along the longitudinal axis within the interior chamber for receiving a plurality of heat generating components of the electronic assembly thereon; and
      (ii) at least one interior groove extending along the longitudinal axis within the interior chamber; and
   (b) at least one retaining clip for biasing the heat generating components into thermal contact with the heat transfer surface of the housing, each retaining clip having:
      (i) a clip length;
      (ii) a first portion extending along the clip length for engaging the interior groove of the housing so as to secure the retaining clip in place; and
      (iii) a second portion extending along the clip length and spaced apart from the first portion for engaging the plurality of heat generating components;
   (c) wherein the retaining clip is made from a resilient material and is sized and shaped such that positioning the first portion in the interior groove flexes the retaining clip and presses the second portion against the heat generating components so as to bias the heat generating components into thermal contact with the heat transfer surface; and
   (d) wherein the housing has at least one sloped wall, the heat transfer surface being located on the sloped wall.

2. The enclosure of claim 1, wherein the second portion includes a plurality of tabs spaced apart along the clip length, each tab being sized and shaped to engage a corresponding one of the plurality of heat generating components.

3. The enclosure of claim 1, wherein the housing has a housing length extending along the longitudinal axis, and wherein the clip length is at least 50% of the housing length.

4. The enclosure of claim 1, wherein the housing has an exterior opening for receiving at least one electrical connector extending outwardly from the interior chamber.

5. The enclosure of claim 4, wherein the exterior opening extends along the longitudinal axis.

6. The enclosure of claim 5, further comprising a sealing member for covering the exterior opening, the sealing member having at least one aperture for receiving the at least one electrical connector therethrough.

7. The enclosure of claim 6, wherein the sealing member is made from an elastomeric material.

8. The enclosure of claim 5, wherein the exterior opening has a transverse width of less than about 30 millimeters.

9. The enclosure of claim 1, wherein the housing extends longitudinally between two opposing open ends, and wherein the enclosure further comprises end caps for covering the opposing open ends.

10. The enclosure of claim 9, wherein at least one of end caps has a peripheral edge with at least one wire channel therein for receiving a wire extending from at least one wire terminal and out the end cap, the wire channel being sized and shaped to provide mechanical strain relief for the wire.

11. The enclosure of claim 9, wherein at least one of the end caps has drainage holes therein.

12. The enclosure of claim 1, wherein the housing is made from an extruded profile.

13. A power controller comprising:
(a) a housing extending along a longitudinal axis and defining an interior chamber, the housing being made of a thermally conductive material so as to operate as a heat sink, the housing having:
 (i) at least one heat transfer surface extending along the longitudinal axis within the interior chamber; and
 (ii) at least one interior groove extending along the longitudinal axis within the interior chamber;
(b) an electronic assembly positioned within the interior chamber, the electronic assembly including a plurality of heat generating components positioned on the heat transfer surface of the housing; and
(c) at least one retaining clip for biasing the heat generating components into thermal contact with the heat transfer surface of the housing, each retaining clip having:
 (i) a clip length;
 (ii) a first portion extending along the clip length for engaging the interior groove of the housing so as to secure the retaining clip in place; and
 (iii) a second portion extending along the clip length and spaced apart from the first portion for engaging the plurality of heat generating components;
(d) wherein the retaining clip is made from a resilient material and is sized and shaped such that positioning the first portion in the interior groove flexes the retaining clip and presses the second portion against the heat generating components so as to bias the heat generating components into thermal contact with the heat transfer surface; and
(e) wherein the housing has at least one sloped wall, the heat transfer surface being located on the sloped wall.

14. The power controller of claim 13, wherein the second portion includes a plurality of tabs spaced apart along the clip length, each tab being sized and shaped to engage a corresponding one of the plurality of heat generating components.

15. The power controller of claim 13, wherein the housing has a housing length extending along the longitudinal axis, and wherein the clip length is at least 50% of the housing length.

16. The power controller of claim 13, wherein the housing has an exterior opening for receiving at least one electrical connector extending outwardly from the interior chamber.

17. The power controller of claim 16, wherein the exterior opening extends along the longitudinal axis.

18. The power controller of claim 17, further comprising a sealing member for covering the exterior opening, the sealing member having at least one aperture for receiving the at least one electrical connector therethrough.

19. The power controller of claim 18, wherein the sealing member is made from an elastomeric material.

20. An enclosure comprising:
(a) a housing extending along a longitudinal axis and defining an interior chamber for receiving an electronic assembly, the housing being made of a thermally conductive material so as to operate as a heat sink, the housing having:
 (i) at least one heat transfer surface extending along the longitudinal axis within the interior chamber for receiving a plurality of heat generating components of the electronic assembly thereon; and
 (ii) at least one interior groove extending along the longitudinal axis within the interior chamber; and
(b) at least one retaining clip for biasing the heat generating components into thermal contact with the heat transfer surface of the housing, each retaining clip having:
 (i) a clip length;
 (ii) a first portion extending along the clip length for engaging the interior groove of the housing so as to secure the retaining clip in place; and
 (iii) a second portion extending along the clip length and spaced apart from the first portion for engaging the plurality of heat generating components;
(c) wherein the retaining clip is made from a resilient material and is sized and shaped such that positioning the first portion in the interior groove flexes the retaining clip and presses the second portion against the heat generating components so as to bias the heat generating components into thermal contact with the heat transfer surface;
(d) wherein the housing extends longitudinally between two opposing open ends, and wherein the enclosure further comprises end caps for covering the opposing open ends; and
(e) wherein at least one of end caps has a peripheral edge with at least one wire channel therein for receiving a wire extending from at least one wire terminal and out the end cap, the wire channel being sized and shaped to provide mechanical strain relief for the wire.

* * * * *